United States Patent
Ito et al.

(10) Patent No.: US 8,166,568 B2
(45) Date of Patent: Apr. 24, 2012

(54) CONTACT PROBE PIN FOR SEMICONDUCTOR TEST APPARATUS

(75) Inventors: Hirotaka Ito, Kobe (JP); Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 105 days.

(21) Appl. No.: 12/847,442

(22) Filed: Jul. 30, 2010

(65) Prior Publication Data

US 2011/0067151 A1  Mar. 17, 2011

(30) Foreign Application Priority Data

Sep. 15, 2009  (JP) ................................ 2009-213419

(51) Int. Cl.
*G01N 13/16* (2006.01)
*G01Q 70/14* (2010.01)

(52) U.S. Cl. .................. 850/21; 850/40; 850/56; 850/59

(58) Field of Classification Search .................... 850/21, 850/40, 56, 59

See application file for complete search history.

(56) References Cited

U.S. PATENT DOCUMENTS

| | | | |
|---|---|---|---|
| 5,010,249 A | 4/1991 | Nishikawa | |
| 6,459,280 B1 * | 10/2002 | Bhushan et al. | 324/671 |
| 6,724,199 B1 * | 4/2004 | Bhushan et al. | 324/671 |
| 6,756,791 B1 * | 6/2004 | Bhushan et al. | 324/671 |
| 2003/0034782 A1 | 2/2003 | Hirano et al. | |

FOREIGN PATENT DOCUMENTS

| | | |
|---|---|---|
| JP | 62-293734 | 12/1987 |
| JP | 2003-149267 | 5/2003 |
| JP | 2006-38641 | 2/2006 |
| JP | 2007-24613 | 2/2007 |
| JP | 2009-6470 | 1/2009 |

OTHER PUBLICATIONS

European Search Report issued Oct. 21, 2010, in European Patent Application No. 10008485.4.

* cited by examiner

*Primary Examiner* — Nikita Wells

(74) *Attorney, Agent, or Firm* — Oblon, Spivak, McClelland, Maier & Neustadt, L.L.P.

(57) ABSTRACT

It is an object to provide a contact probe pin for a semiconductor test apparatus, including an amorphous carbon type conductive film formed on the probe pin base material surface. The conductive film is excellent in tin adhesion resistance of preventing tin which is the main component of solder from adhering to the contact part of the probe pin during contact between the probe pin and solder. The contact probe pin for a semiconductor test apparatus, includes an amorphous carbon type conductive film formed on the conductive base material surface. The amorphous carbon type conductive film has an outer surface with a surface roughness (Ra) of 6.0 nm or less, a root square slope (R$\Delta$q) of 0.28 or less, and a mean value (R) of curvature radii of concave part tips of the surface form of 180 nm or more, in a 4-$\mu m^2$ scan range by an atomic force microscope.

4 Claims, 1 Drawing Sheet

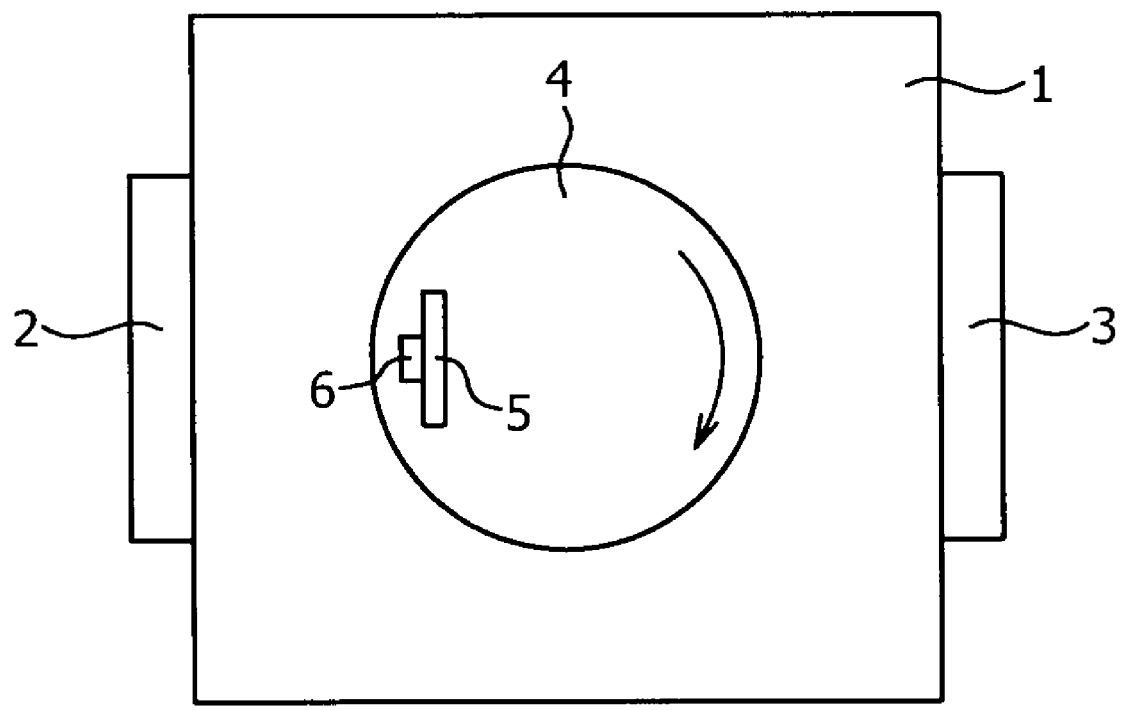

CONTACT PROBE PIN FOR SEMICONDUCTOR TEST APPARATUS

BACKGROUND OF THE INVENTION

1. Field of the Invention

The present invention relates to a contact probe pin for a semiconductor test apparatus in which an amorphous carbon type conductive film is formed on the conductive base material surface. More particularly, it relates to a contact probe pin for a semiconductor test apparatus in which an amorphous carbon type conductive film is formed on the base material surface, the amorphous carbon type conductive film being excellent in tin adhesion resistance of preventing tin which is the main component of solder from adhering to the contact part of the probe pin during contact between the probe pin and solder.

2. Background Art

The probe pin for a semiconductor test apparatus repeatedly comes in contact with solder which is the opponent material of the probe pin in a semiconductor test. Accordingly, during that time, tin which is the main component of the solder may adhere to the contact part of the probe pin. When the adhered tin is oxidized, an increase in resistance occurs, which causes a trouble in the test. For this reason, adhesion of tin not only causes shortening of the life as the probe pin but also causes reduction of the productivity of the semiconductor.

As the related-art technology in which attention is focused on the relation between the surface texture of the probe pin itself and the adhesion property of tin to the surface, for example, Patent Document 1 proposes a technology in which the maximum height Ry in surface roughness of the contact terminal is set at 10 μm or less. In Patent Document 1, it is assumed that the surface roughness can be achieved by subjecting the contact terminal base material surface to mechanical chemical polishing or dry polishing. Further, on the uppermost surface, a carbon film including a metal element is formed. However, the surface roughness of the carbon film is assumed to reflect the shape of the base material surface. Accordingly, there is no study on the effect of the surface texture of the carbon film itself exerted on the tin adhesion property.

Whereas, as the related-art technology on an amorphous carbon type film and the surface texture thereof, for example, in Patent Document 2, in order to control the surface texture resulting from attachment and detachment of foreign matter particles formed in arc ion plating, there is proposed a method in which formation of foreign matter particles during deposition is suppressed by implementing T-shape filtered arc. However, in Patent Document 2, there is no presentation of a technology of controlling the microscopic structure with no foreign matter particles present therein as with the film obtainable by a sputtering method.

Citation List

Patent Documents

[Patent Document 1] JP-A-2007-24613
[Patent Document 2] JP-A-2009-6470

SUMMARY OF THE INVENTION

From the viewpoint of elongating the life of a probe pin for a semiconductor test apparatus, it is necessary to prevent tin which is the main component of solder from adhering to the contact part of the probe pin in contact with solder during the semiconductor test. However, no satisfactory proposals have been made up to now.

For example, in Patent Document 1, there is proposed a method in which the maximum height Ry in surface roughness is set at 10 μm or less by polishing the surface of the probe pin base material. However, a study by the present inventors reveals the following: when a film is formed on the base material, the surface texture of the film surface affects the tin adhesion property; thus even in a region with a surface roughness such that Ry satisfies 10 μm or less, adhesion of tin becomes a problem according to the conditions during film manufacturing, and the like.

The present invention was made in view of such a problem. It is an object of the present invention to provide a contact probe pin for a semiconductor test apparatus, including an amorphous carbon type conductive film formed on the conductive base material surface. The amorphous carbon type conductive film is excellent in tin adhesion resistance of preventing tin which is the main component of solder from adhering to the contact part of the probe pin during contact between the probe pin and solder.

The present inventors focused attention on the effect of the surface texture in a microscopic region of the film exerted on the tin adhesion resistance, not conventionally studied in the process of studying the relation between the surface texture and the tin adhesion resistance of the film formed on the surface of the probe pin for a semiconductor test apparatus. As a result, the present inventors found out that the tin adhesion resistance is remarkably improved by controlling the surface texture parameters of the microscopic region of the film. This led to the present invention.

Namely, in accordance with an aspect of the present invention, there is provided a contact probe pin for a semiconductor test apparatus, which includes: a conductive base material; and an amorphous carbon type conductive film formed on the conductive base material surface, wherein the amorphous carbon type conductive film has an outer surface with a surface roughness (Ra) of 6.0 nm or less, a root square slope (RΔq) of 0.28 or less, and a mean value (R) of curvature radii of the tips of concave parts of the surface form of 180 nm or more, in a 4-μm$^2$ scan range by an atomic force microscope.

With this configuration, for the amorphous carbon type conductive film formed on the conductive base material surface, in a scan range in which microscopic asperities on the outer surface can be detected to allow proper evaluation of the surface texture, three surface texture parameters are controlled within their respective prescribed numerical value ranges described above. For this reason, the tin adhesion property to the outer surface of the amorphous carbon type conductive film can be remarkably reduced. This can reduce the occurrence of troubles of the contact probe pin for a semiconductor test apparatus, which can implement a longer life.

Further, preferably, the contact probe pin for a semiconductor test apparatus includes an intermediate layer between the conductive base material surface and the amorphous carbon type conductive film of the probe pin, wherein the intermediate layer includes a metal element, and has a thickness of 5 to 600 nm. With this configuration, the growth of the crystal grains of the metal included in the intermediate layer can be suppressed. This can reduce the size of the asperities on the outer surface of the amorphous carbon type conductive film formed on the intermediate layer, and further can ensure the adhesion with the probe pin base material.

Further, in the contact probe pin for a semiconductor test apparatus, the total thickness of the intermediate layer and the amorphous carbon type conductive film is preferably 50 to 2000 nm from the viewpoints of keeping the coating effect and reducing the size of the asperities on the amorphous carbon type conductive film surface.

Still further, preferably, the intermediate layer includes: a first intermediate layer including a metal element; and a second intermediate layer including the metal element and carbon, and having a gradient composition in which the ratio of numbers of atoms of the metal element to carbon decreases in the thickness direction from the base material surface toward the amorphous carbon type conductive film, and the second intermediate layer is formed between the first intermediate layer and the amorphous carbon type conductive film. With this configuration, it is possible to further enhance the adhesion of the amorphous carbon type conductive film to the probe pin base material surface.

Advantageous Effect of the Invention

In accordance with the present invention, with the amorphous carbon type conductive film formed on the conductive base material surface of the probe pin for a semiconductor test apparatus, it is possible to remarkably reduce the tin adhesion property that when the probe pin comes in contact with solder, tin which is the main component of the solder adheres to the contact part of the probe pin. This can reduce the occurrence of troubles of the contact probe pin for a semiconductor test apparatus, which can implement a longer life.

BRIEF DESCRIPTION OF THE DRAWING

FIG. 1 is a schematic view showing a structure of the inside of a chamber for forming an amorphous carbon type conductive film in accordance with the present embodiment on the substrate surface by a sputtering method.

DESCRIPTION OF THE PREFERRED EMBODIMENTS

[Embodiment 1]

One aspect of the present invention is a contact probe pin for a semiconductor test apparatus including an amorphous carbon type conductive film formed on the surface of a conductive base material of the probe pin. First, in Embodiment 1, a description will be given to an embodiment in which the amorphous carbon type conductive film is directly formed on the surface of the conductive base material, namely, an embodiment in which an intermediate layer described later is not provided between the conductive base material surface and the amorphous carbon type conductive film.

The amorphous carbon type conductive film in accordance with this embodiment has an outer surface with a surface roughness (Ra) of 6.0 nm or less, a root square slope (RΔq) of 0.28 or less, and a mean value (R) of curvature radii of the tips of concave parts of the surface form of 180 nm or more in a 4-$\mu m^2$ scan range with an atomic force microscope.

In this embodiment, the region of the outer surface for detecting the surface texture parameters of the amorphous carbon type conductive film was set at the scan range of 4 $\mu m^2$ with an atomic force microscope. This is for the following reason.

The Patent Document 1 shows a technology in which the surface roughness of the base material is made to have the maximum height Ry of 10 $\mu m$ or less by polishing the base material of the probe pin. In the Patent Document 1, Ry is determined by measuring a 100 $\mu m \times 200$ $\mu m$ region with 139×277 pixels by a laser microscope. This results in a measurement at an interval of about 720 nm. Accordingly, the asperity shapes smaller than that are missed. In contrast, with the measurement for 2 $\mu m \times 2$ $\mu m$ by an atomic force microscope (AFM) used in this embodiment, the numbers of data points are 512 along the X direction, and 256 along the Y direction. This results in that the measurement is made at an interval of 7.8 nm even with calculation based on 256 points. For this reason, with an AFM, it is also possible to detect microscopic asperities not detectable with a laser microscope.

As for the size of the scanning region with an AFM, for example, when the size is 10 $\mu m \times 10$ $\mu m$ or less, the evaluation of the surface texture is possible. However, when the region is larger than 2 $\mu m \times 2$ $\mu m$, the surface texture becomes more susceptible to the effects of the base material and the effects of contamination. As a result, a proper evaluation thereof may be unable to be performed. Whereas, when the size of the region is less than 2 $\mu m \times 2$ $\mu m$, for example, 1 $\mu m \times 1$ $\mu m$ or less, the number of asperities on the surface is insufficient. This results in a high possibility that respective surface texture parameters vary among the measurement sites. Therefore, by setting the 2 $\mu m \times 2$ $\mu m=4$ $\mu m^2$ region as the scan range, it is possible to properly evaluate the surface texture of the amorphous carbon type conductive film.

Then, a description will be given to the surface texture parameters in the outer surface of the amorphous carbon type conductive film. In accordance with the results of the study on the relation between respective surface texture parameters and the tin adhesion property conducted by the present inventors, it has been revealed that three surface texture parameters of surface roughness (Ra), root square slope (RΔq), and the mean value (R) of curvature radii of the tips of convex parts of the surface form largely affect the tin adhesion property.

The surface roughness (Ra) in this embodiment is a value obtained by determining the arithmetic mean roughness defined in JIS B0601 three-dimensionally, and a value obtained by averaging the absolute values of deviations between the reference plane and the specified plane. Whereas, the root square slope (RΔq) in this embodiment is a value obtained by determining the root mean square slope defined in JIS B0601 three-dimensionally, and represents the slope of roughness. A smoother surface results in a smaller value of RΔq. Further, the mean value (R) of curvature radii of the tips of convex parts of the surface form in this embodiment is a value obtained by determining the curvature radii of convex parts of the surface form, and averaging respective values.

The surface texture parameters can be calculated, for example, in the following manner. Namely, as image data, there can be used the image data obtained by subjecting an image in a 2 $\mu m \times 2$ $\mu m$ scan range to average slant correction in both the directions of the X direction (512 pixels) and the Y direction (256 pixels) by using an AFM apparatus (SPI4000 manufactured by SII Co.) with surface processing software attached to the apparatus. Each parameter can be calculated by performing a processing with processing software (ProAna3D). Incidentally, ProAna3D is available from the following URL: http//www13.plala.or.jp/Uchi/ProgFramel.html.

For the surface roughness (Ra) and the root square slope (RΔq) (which are expressed as Sa and SΔq, respectively, because these are two-dimensional data in ProAna3D), processing can be performed using image data subjected to average slant correction in both the directions of the X direction and the Y direction. For the mean value (R) of curvature radii of the tips of convex parts of the surface form, the R value can be determined after performing a processing such that the load area ratio (the area of projecting portions relative to the whole) is 20% with the processing software (ProAna3D) using image data subjected to average slant correction in both the directions of the X direction and the Y direction. As for the curvature radius, with the software, the major axis and the minor axis are determined with the convex part as an ellipse. However, for the major axis direction, the curvature radius with some particles connected may be determined. For this reason, the curvature radius in the minor axis direction can be taken as the mean value (R) of curvature radii of the tips.

In this embodiment, the surface roughness (Ra) in the outer surface of the amorphous carbon type conductive film is 6.0 nm or less. When the surface roughness (Ra) exceeds 6.0 nm, the adhesion amount of tin excessively increases, which tends to cause troubles for use in an actual probe. Ra is more preferably 5.0 nm or less, further preferably 2.5 nm or less, and most preferably 1.0 nm or less. The closer to zero Ra is, the smaller the adhesion amount of tin is. For this reason, the lower limit value of Ra has no particular restriction.

In this embodiment, the root square slope (RΔq) in the outer surface of the amorphous carbon type conductive film is 0.28 or less. When the root square slope (RΔq) exceeds 0.28, the adhesion amount of tin tends to excessively increase, which may cause troubles for use in an actual probe. RΔq is more preferably 0.20 or less, further preferably 0.15 or less, and most preferably 0.10 or less. The closer to zero RΔq is, the smaller the adhesion amount of tin is. For this reason, the lower limit value of RΔq has no particular restriction.

In this embodiment, the mean value (R) of curvature radii of the tips of convex parts of the surface form in the outer surface of the amorphous carbon type conductive film is 180 nm or more. When the mean value (R) of curvature radii of the tips of convex parts of the surface form is less than 180 nm, the adhesion amount of tin excessively increases, which tends to cause troubles for use in an actual probe. R is more preferably 250 nm or more, further preferably 350 nm or more, and most preferably 400 nm or more. The closer to infinity R is, the smaller the adhesion amount of tin is. For this reason, the upper limit value of R has no particular restriction.

The amorphous carbon type conductive film in accordance with this embodiment preferably includes at least one metal selected from the group consisting of Ti, V, Nb, Zr, Mo, W, Ta, Hf, Cr, Mn, Fe, Co, and Ni in an amount of 0.5 to 50 at %. Inclusion of the metal can impart the electric conductivity to the amorphous carbon film inherently having a small electric conductivity characteristic. Particularly, as at least one metal, W having an effect of suppressing the tin adhesion property is preferably included therein. When the content of the metal exceeds 50 at %, an oxide of the metal becomes more likely to be formed. As a result, the reliability of the semiconductor test tends to be reduced. Whereas, when the content is less than 0.5 at %, the electric conductivity imparting effect by metal addition tends to be insufficient. The content of the metal in the amorphous carbon type conductive film is more preferably 5 to 40 at %, and further preferably 10 to 30 at %.

The thickness of the amorphous carbon type conductive film in accordance with this embodiment is preferably 50 to 2000 nm when an intermediate layer described later is not provided. When the thickness of the film exceeds 2000 nm, the asperities on the outer surface tend to become large. For this reason, the three surface texture parameters more often do not satisfy their respective prescribed numerical value ranges. On the other hand, when the thickness is less than 50 nm, the film is worn out, so that the base material becomes more likely to be exposed. A smaller film thickness results in a smoother surface and a smaller internal stress. Accordingly, the film becomes less likely to be peeled. For this reason, the thickness of the film is more preferably 1000 nm or less, further preferably 700 nm or less, and still further preferably 400 nm or less.

In this embodiment, as a method for forming an amorphous carbon type conductive film having an outer surface such that the three surface texture parameters satisfy their respective prescribed numerical value ranges on the base material surface of a probe pin for a semiconductor test apparatus, a sputtering method is preferably used. With the sputtering method, for example, one carbon target and individual targets of the respective metals to be included in the amorphous carbon film can be used simultaneously. Alternatively, a composite target of carbon and the metals can be used. According to the sputtering method, it is possible to form an amorphous carbon type conductive film having a low electric resistance and a good quality. Further, it is possible to readily introduce the metals in the amorphous carbon type conductive film in given contents. Further, the sputtering method is a preferable deposition method also in terms of being less likely to produce a cause degrading the smoothness of the deposited surface such as droplets observable with an arc ion plating (AIP) method.

From the viewpoint of smoothing the surface texture of the amorphous carbon type conductive film, it is more preferable to use a magnetron sputtering method, particularly, an unbalanced magnetron sputtering method. With this method, it is possible to widen the plasma space to the vicinity of the substrate. This enables an increase in amount of inert gas ions such as Ar gas ions, and also exposure of the inert gas ions to the substrate. By exposure of the inert gas ions, the kinetic energy of the inert gas ions contributes to the improvement of the heat energy of sputtering particles which have reached the substrate. The improvement of the heat energy of the sputtering particles facilitates the movement of the particles on the substrate. As a result, the film is densified, resulting in a smooth film. In order to further enhance the effects, a bias is applied to the substrate. This can control the energy of Ar gas ions, which can further enhance the surface smoothness.

[Embodiment 2]

Then, a description will be given to an embodiment in which an intermediate layer is formed between the conductive base material surface and the amorphous carbon type conductive film of the probe pin for a semiconductor test apparatus.

The intermediate layer in accordance with this embodiment has a role of enhancing the adhesion of the amorphous carbon type conductive film to the conductive base material surface. For this reason, from the viewpoint of ensuring the adhesion to the probe pin surface, it is preferable that the intermediate layer is formed between the base material surface and the amorphous carbon type conductive film of the probe pin.

The intermediate layer in accordance with this embodiment preferably includes at least one metal element selected from Cr, W, Ti, and Ni. Out of these metals, Cr or W is preferable.

In this embodiment, the thickness of the intermediate layer is preferably 5 to 600 nm. By setting the thickness at 600 nm or less, the growth of the crystal grains of the metal included in the intermediate layer can be suppressed. This can reduce the size of the asperities on the outer surface of the amorphous carbon type conductive film formed on the intermediate layer. From the viewpoint of suppressing the growth of crystal grains, the thickness of the intermediate layer is more preferably 500 nm or less, and further preferably 300 nm or less. Whereas, from the viewpoint of ensuring the adhesion with the probe pin base material, the thickness of the intermediate layer is preferably set at 5 nm or more.

Further, in this embodiment, the total thickness of the intermediate layer and the amorphous carbon type conductive film is preferably 50 to 2000 nm. When the thickness exceeds 2000 nm, the asperities on the surface of the amorphous carbon type conductive film caused by an increase in film thickness become larger. This makes it difficult to control the surface texture parameters within prescribed ranges. With a reduction of the film thickness, the surface of the amorphous carbon type conductive film becomes smoother. For this reason, the film thickness is more preferably 1500 nm or less, and further preferably 1000 nm or less. Further, when the film thickness is too small, the film is worn out, so that the probe pin base material becomes more likely to be exposed. As a result, the effect of coating is weakened. For this reason, the film thickness is preferably 50 nm or more.

In this embodiment, the intermediate layer preferably has a first intermediate layer formed on the conductive base material of the probe pin, and a second intermediate layer formed between the first intermediate layer and the amorphous carbon type conductive film. Incidentally, the first intermediate layer may be replaced with the second intermediate layer.

The first intermediate layer preferably includes only at least one metal element selected from the metal elements, namely, Cr, W, Ti, and Ni. Particularly, the first intermediate layer preferably includes only Cr or W.

Further, preferably, the second intermediate layer includes the metal elements and carbon, and has a gradient composition in which the ratio of numbers of atoms of the metal elements to carbon decreases in the thickness direction from the base material surface toward the amorphous carbon type conductive film. In the second intermediate layer, in the thickness direction from the amorphous carbon type conductive film toward the base material surface, the composition of the metal elements relative to carbon continuously increases. For this reason, the adhesion of the amorphous carbon type conductive film to the base material surface can be improved. When there is no second intermediate layer, namely, when the intermediate layer includes only the first intermediate layer, the composition largely changes at the interface between the first intermediate layer including only the metal elements and the amorphous carbon type conductive film. Accordingly, the amorphous carbon type conductive film may be peeled from the interface when applied with a force.

In this embodiment, as a method for forming the intermediate layer, namely, the intermediate layer preferably having a thickness of 5 to 600 nm on the conductive base material of the probe pin, a sputtering method, particularly, an unbalanced magnetron sputtering method is preferably used for the same reason as with the amorphous carbon type conductive film. In that case, the following configuration can be adopted: first, the intermediate layer is formed on the conductive base material; then, on the intermediate layer, the amorphous carbon type conductive film described in the Embodiment 1 is formed.

Further, as the method for forming the first intermediate layer on the conductive base material of the probe pin, or the method for forming the second intermediate layer on the first intermediate layer or directly on the conductive base material, a sputtering method is also preferably used.

For the first intermediate layer, by using a target of the metal, it is possible to deposit the first intermediate layer including the metal with ease. Further, when the second intermediate layer having the gradient composition is formed, a plurality of targets are prepared in the sputtering method, and the input electric powers to respective targets are adjusted. As a result, it is possible to deposit the second intermediate layer having a continuously changing gradient composition with ease.

Up to this point, the embodiments of the present invention were described in details. However, the foregoing description is illustrative in all aspects, and should not be construed as limiting the scope of the present invention. It is understood that innumerable modified examples which are not exemplified can be conceived without deviating from the scope of the present invention

EXAMPLES

Below, examples in accordance with the present invention will be shown, which should not be construed as limiting the scope of the present invention.

(Formation of Amorphous Carbon Type Conductive Film)

Using an unbalanced magnetron sputtering apparatus (UBM202) manufactured by KOBE STEEL LTD., deposition was carried out. FIG. 1 shows the structure of the inside of a vacuum chamber 1 in which an amorphous carbon type conductive film is formed on a substrate. For deposition of the first intermediate layer, as a metal target 2, a Cr or W target was used. For deposition of the amorphous carbon type conductive film, as a target, there was used a composite target 3 in which a 1-mm dia tungsten wire was disposed on a carbon target. The substrate was set on a substrate holder 5 disposed on a substrate stage 4 so as to be in parallel with the target. Thus, deposition was carried out by rotating the table. As the base material, a glass substrate 6 was used. The base material was introduced into the apparatus, followed by evacuation to $1\times10^{-3}$ Pa or less. Then, deposition was carried out. As a process gas, an Ar gas was used. The gas pressure during deposition was made constant at 0.6 Pa.

First, the Cr or W target was applied with an input electric power of 0.2 kW. Then, a given time was taken to change the input electric power to the Cr (or W) target from 0.2 kW to 0 kW, and to change the input electric power to the composite target from 0.02 kW to 2.0 kW. As a result, a first intermediate layer including Cr (or W) and a second intermediate layer having a gradient composition of Cr (or W)-WC were formed. After formation of the intermediate layer, the input electric power to the composite target was set at 2.0 kW. As a result, a W-containing amorphous carbon type conductive film (diamond-like carbon (DLC)) (which will be hereinafter also referred to as W-DLC) was deposited.

The thickness of each layer was set to the objective film thickness by changing the deposition time. Previously, the deposition rate of each layer was examined, and the deposition time such as to result in each layer thickness was calculated. Then, deposition was carried out. The film thickness of the monolayer film was measured by means of a stylus profilometer (DEKTAK6M). For the lamination, the overall film thickness was measured by means of a stylus profilometer. Then, each layer thickness was calculated in view of the deposition rate and the deposition time. For some samples, TEM observation of each cross section was performed, indicating that there was no difference between the thickness of each layer and the calculated value thereof.

Table 1 shows the film configuration, the thickness of the intermediate layer, and the overall film thickness of each sample for samples each including only the amorphous carbon type conductive film deposited therein (Nos. 8 and 9), a sample having the first intermediate layer (No. 7), and samples each having the first intermediate layer and the second intermediate layer (Nos. 1 to 6 including Cr for the first intermediate layer, and Nos. 10 to 14 including W for the first intermediate layer).

(Measurement of Surface Texture Parameters)

The surface texture parameters were measured using an AFM apparatus (SPI4000 manufactured by SII Co.). As the probe, an attached SN-AF01 probe with a length of 100 μm was used. The measurement was carried out in the atmosphere. With a scan range of 10 μm×10 μm, a site free from contamination or the like was confirmed. Then, a 2 μm×2 μm measurement was carried out. For calculation of various parameters of the surface texture, there was used image data obtained by subjecting a 2 μm×2 μm image to average slant correction in both the directions of the X direction and the Y direction with the surface processing software attached to the apparatus (SPI4000). For various parameters, processing was carried out with the processing software (ProAna3D).

For Ra and RΔq (which are expressed as Sa and SΔq, respectively, in ProAna3D because they are two-dimensional data), processing was carried out using image data subjected to average slant correction in both the directions of the X direction (512 pixels) and the Y direction (256 pixels). For the mean value (R) of curvature radii of the tips of convex parts of the surface form, the R value was determined after performing a processing such that the load area ratio (the area of projecting portions relative to the whole) is 20% with the processing software (ProAna3D) using image data subjected to average slant correction in both the directions of the X direction and the Y direction. As for the curvature radius, with the software, the major axis and the minor axis are determined with the convex part as an ellipse However, for the major axis direction, the curvature radius with some particles connected may be determined. For this reason, the curvature radius in the minor axis direction was taken as the mean value (R) of curvature radii of the tips.

Table 1 shows the surface roughness (Ra) measured with an AFM, the root square slope (RΔq), and the mean value (R) of curvature radii of the tips of convex parts of the surface form for the surface texture of the amorphous carbon type conductive film in each sample described above.

(Evaluation of Tin Adhesion Property)

For evaluation of tin adhesion property, a sliding test using a tin ball was carried out. For the sliding test, a rotation sliding test was carried out by means of a ball-on-disk test apparatus (Tribometer: manufactured by CSM Co.). The rotation radius was set at 1.5 mm; the rotation speed, 0.2 cm/s; and the load, 0.2 N. For the ball, a ball obtained by plating 10-μm tin on SUJ2 (9.5 mm in diameter) was used. The sliding distance was set constant at 0.5 m. Evaluation was carried out based on the amount of tin deposited after the sliding test.

For evaluation of the amount of tin deposited, measurements were carried out at three points on the sliding circumference by means of a profilometer. The deposit cross-sectional areas of respective sites were determined, and the mean value of the three points is shown in Table 1. A sample showing a value of zero did not undergo deposition of tin. For the adhesion amount of tin, when the amount is less than 20 μm², tin is deposited only partially, and adhesion does not occur entirely. However, when the amount is more than 20 μm², tin is deposited entirely. Accordingly, the adhesion property was rated as bad.

(Results)

The results are shown in Table 1.

TABLE 1

| Sample No. | Film configuration — Intermediate layer — First intermediate layer | Film configuration — Intermediate layer — Second intermediate layer | Film configuration — Carbon film | Overall film thickness (nm) | Thickness of intermediate layer (nm) | Surface texture parameters of carbon film — Ra (nm) | Surface texture parameters of carbon film — RΔq | Surface texture parameters of carbon film — R (nm) | Evaluation Sn adhesion amount (μm²) |
|---|---|---|---|---|---|---|---|---|---|
| 1 | Cr | Cr—WC gradient | W-DLC | 2490 | 764 | 7.050 | 0.2980 | 160 | 35 |
| 2 | Cr | Cr—WC gradient | W-DLC | 2133 | 562 | 6.4256 | 0.2864 | 177 | 27 |
| 3 | Cr | Cr—WC gradient | W-DLC | 1938 | 621 | 6.322 | 0.2825 | 171 | 32 |
| 4 | Cr | Cr—WC gradient | W-DLC | 1865 | 526 | 5.813 | 0.2361 | 216 | 15 |
| 5 | Cr | Cr—WC gradient | W-DLC | 1061 | 374 | 3.890 | 0.1760 | 334 | 6 |
| 6 | Cr | Cr—WC gradient | W-DLC | 857 | 253 | 2.482 | 0.1246 | 363 | 0 |
| 7 | Cr | — | W-DLC | 364 | 7 | 1.197 | 0.0855 | 399 | 0 |
| 8 | — | — | W-DLC | 288 | 0 | 0.938 | 0.0732 | 414 | 0 |
| 9 | — | — | W-DLC | 83 | 0 | 0.449 | 0.0274 | 512 | 0 |
| 10 | W | W—WC gradient | W-DLC | 2273 | 611 | 6.316 | 0.2851 | 172 | 26 |
| 11 | W | W—WC gradient | W-DLC | 2052 | 575 | 6.098 | 0.2816 | 178 | 23 |
| 12 | W | W—WC gradient | W-DLC | 1956 | 693 | 6.215 | 0.2845 | 175 | 24 |
| 13 | W | W—WC gradient | W-DLC | 1431 | 452 | 4.852 | 0.1865 | 276 | 9 |
| 14 | W | W—WC gradient | W-DLC | 935 | 258 | 2.129 | 0.1135 | 384 | 0 |

When the overall thickness exceeds 2000 nm, and the thickness of the intermediate layer exceeds 600 nm regardless of whether the first intermediate layer includes Cr or W (Sample Nos. 1 and 10), Ra exceeds 6.0 nm, RΔq exceeds 0.28, and R is less than 180 nm. Accordingly, the adhesion amount of Sn also becomes larger than 20 μm². This can be considered due to the following reason. Growth of crystal grains of the metal included in the intermediate layer coarsens the surface of the intermediate layer, resulting in an increase in size of asperities on the surface of the amorphous WC layer (W-DLC film) formed thereon. Whereas, even in the case of a thickness of the intermediate layer of 600 nm or less, when the overall film thickness exceeds 2000 nm (sample Nos. 2 and 11), the surface of the W-DLC film becomes coarsened. For this reason, Ra exceeds 6.0 nm, RΔq exceeds 0.28, and R is less than 180 nm. Accordingly, the adhesion amount of Sn also becomes larger than 20 μm². Further, even in the case of an overall film thickness of 2000 nm or less, when the thickness of the intermediate layer is larger than 600 nm (sample Nos. 3 and 12), growth of the crystal grains of the metal included in the intermediate layer is promoted. This coarsens the surface form of the intermediate layer, and hence the surface of the W-DLC film formed thereon is also coarsened. For this reason, Ra exceeds 6.0 nm, RΔq exceeds 0.28, and R is less than 180 nm. Accordingly, the adhesion amount of Sn also becomes larger than 20 μm².

In contrast, for the sample in which the overall film thickness is 2000 nm or less, and the thickness of the intermediate layer is 600 nm or less (sample No. 4), Ra is 6.0 nm or less, RΔq is 0.28 or less, and R is 180 nm or more. Accordingly, the adhesion amount of Sn becomes smaller than 20 μm².

Whereas, for the samples in each of which the overall film thickness is 1500 nm or less, and the thickness of the intermediate layer is 500 nm or less (sample Nos. 5 and 13), Ra is 5.0 nm or less, RΔq is 0.20 or less, and R is 250 nm or more. Accordingly, the adhesion amount of Sn becomes one-FIGURE amount. This results in a film more excellent in Sn adhesion property. Further, for the samples in each of which the overall film thickness is 1000 nm or less, and the thickness of the intermediate layer is 300 nm or less (sample Nos. 6 and 14), Ra is 2.5 nm or less, RΔq is 0.15 or less, and R is 350 nm or more. Accordingly, the adhesion amount of Sn becomes zero. This results in a film particularly excellent in Sn adhesion property.

Whereas, also for the sample having only the first intermediate layer (sample No. 7), and the samples each having a W-DLC film deposited therein (sample Nos. 8 and 9), the adhesion amount of Sn becomes zero, resulting in a film particularly excellent in Sn adhesion property.

Further, for the samples in each of which the thickness of the amorphous carbon type conductive film (calculated by subtracting the thickness of the intermediate layer from the overall film thickness) is 50 to 1000 nm or less (sample Nos. 5 to 9, and 13 and 14), the adhesion amount of Sn becomes one-FIGURE amount, resulting in a film excellent in Sn adhesion property.

What is claimed is:

1. A contact probe pin for a semiconductor test apparatus, comprising: a conductive base material; and an amorphous carbon type conductive film formed on the conductive base material surface, the amorphous carbon type conductive film having an outer surface with a surface roughness (Ra) of 6.0 nm or less, a root square slope (RΔq) of 0.28 or less, and a mean value (R) of curvature radii of the tips of concave parts of the surface form of 180 nm or more, in a 4-$\mu m^2$ scan range by an atomic force microscope.

2. The contact probe pin for a semiconductor test apparatus according to claim 1, further comprising an intermediate layer between the conductive base material surface and the amorphous carbon type conductive film, wherein the intermediate layer comprises a metal element, and has a thickness of 5 to 600 nm.

3. The contact probe pin for a semiconductor test apparatus according to claim 2, wherein the total thickness of the intermediate layer and the amorphous carbon type conductive film is 50 to 2000 nm.

4. The contact probe pin for a semiconductor test apparatus according to claim 2,
wherein the intermediate layer, comprises:
a first intermediate layer comprising a metal element; and
a second intermediate layer comprising the metal element and carbon, and having a gradient composition in which the ratio of numbers of atoms of the metal element to carbon decreases in the thickness direction from the base material surface toward the amorphous carbon type conductive film, and
the second intermediate layer is formed between the first intermediate layer and the amorphous carbon type conductive film.

* * * * *